United States Patent [19]

Itani

[11] Patent Number: 4,535,400
[45] Date of Patent: Aug. 13, 1985

[54] MEANS AND METHOD FOR SIMULTANEOUSLY TRIGGERING SERIES SCR'S

[75] Inventor: Abdallah M. Itani, Saratoga, N.Y.

[73] Assignee: General Electric Company, Schenectady, N.Y.

[21] Appl. No.: 529,307

[22] Filed: Sep. 6, 1983

[51] Int. Cl.³ .................... H02M 7/12; H03K 17/56
[52] U.S. Cl. ........................... 363/68; 307/252 L; 363/128
[58] Field of Search .......... 307/252 K, 252 M, 252 Q, 307/252 L; 363/68, 128

[56] References Cited

U.S. PATENT DOCUMENTS

| | | | |
|---|---|---|---|
| 3,596,168 | 7/1971 | Hengsberger | 363/68 |
| 3,723,847 | 3/1973 | Chaupit | 363/68 |
| 3,938,026 | 2/1976 | Hoffmann et al. | 363/128 |
| 4,370,607 | 1/1983 | Dassonville | 323/271 |

Primary Examiner—Peter S. Wong
Assistant Examiner—D. L. Rebsch
Attorney, Agent, or Firm—Bernard J. Lacomis; James C. Davis, Jr.

[57] ABSTRACT

A method for simultaneously triggering a plurality of serially connected SCR's transfers energy from a relatively low voltage energy source to each of a plurality of energy storage devices which are coupled respectively to the gate of a corresponding SCR through a respective switching device. The energy from each storage device is simultaneously discharged into the gate of each respective SCR by a respective trigger signal from the low voltage energy source to each respective switching device.

Apparatus for simultaneously triggering a plurality of serially connected SCR's comprises a pulse transformer for transferring energy from a relatively low voltage source of energy.

5 Claims, 8 Drawing Figures

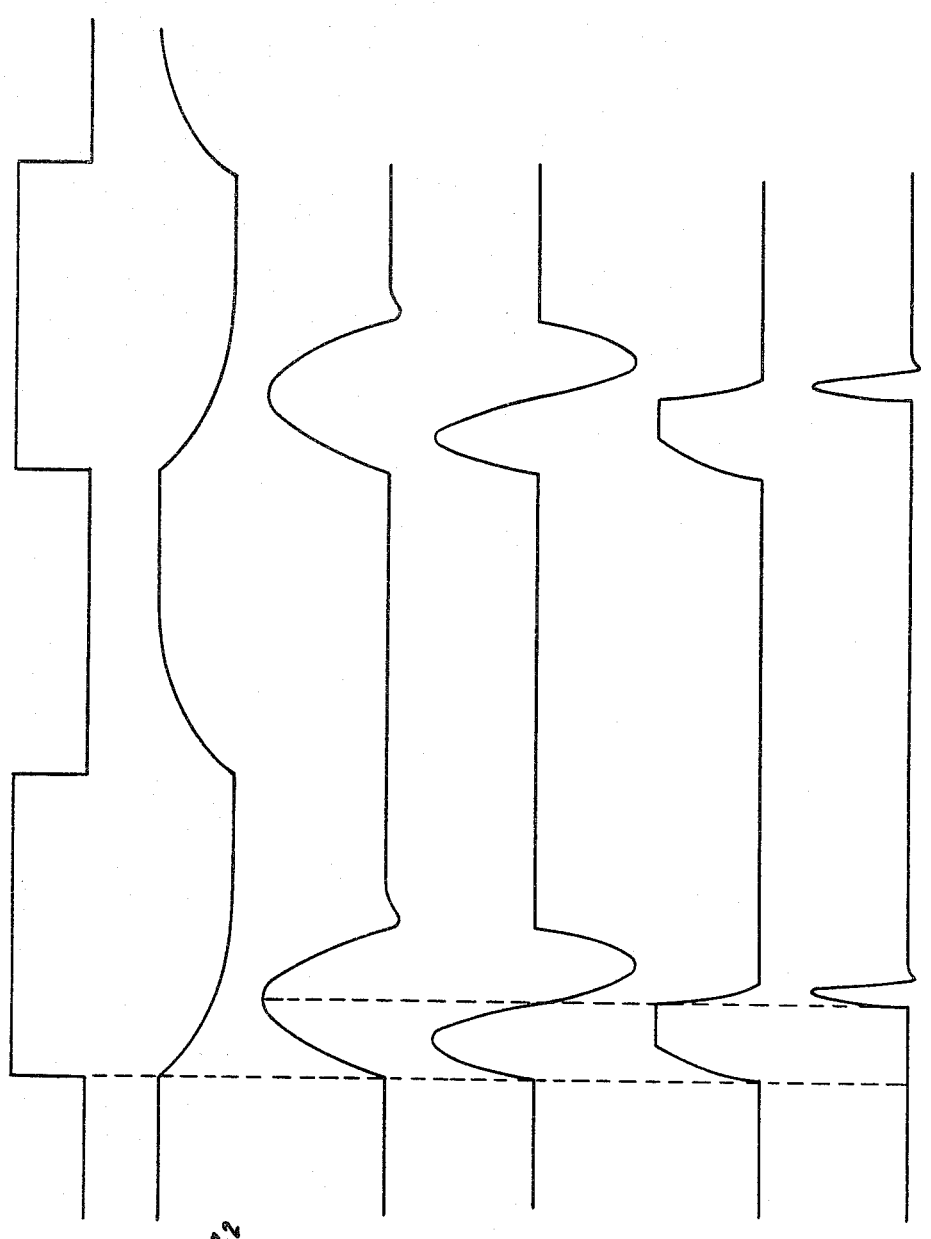

MEANS AND METHOD FOR SIMULTANEOUSLY TRIGGERING SERIES SCR'S

BACKGROUND OF THE INVENTION

This invention relates to a means and method for simultaneously triggering serially connected SCR's and, more particularly, to circuitry for simultaneously triggering serially connected SCR's via a plurality of pulse transformers in a reliable and cost effective manner, in order to maintain equalization of voltage sharing among the SCR's.

When switching of an operating voltage in excess of the blocking voltage capabilities of a single SCR is desired or necessary, a series combination of SCR's can be employed if certain design considerations are observed. Such considerations include equalization of voltage sharing (both forward and reverse) between individual SCR's at steady state and transient operating conditions, external voltage equalization network and gating circuit design. Also, component parameter variations such as junction capacitances, delay times, forward voltage drops, reverse recovery time for individual SCR's (e.g. snubber circuits) must be taken into account.

Present means and methods used with circuits for triggering serially connected SCR's include techniques catagorized broadly as simultaneous triggering and slave triggering. In slave triggering for serially connected SCR's, the gate of a master SCR of the serially connected SCR's is first triggered, and as its forward blocking voltage begins to collapse a gate signal for triggering is applied to a slave or next serially connected SCR. As the forward blocking voltage of the slave SCR begins to collapse, a gate signal for triggering may be applied to a second slave SCR. This process may be repeated, thus providing sequential or staggered triggering of serially connected SCR's. The entire operating voltage must be supported or blocked by those serially connected SCR's which have not yet switched, which may cause the voltage across an individual SCR to exceed its rated peak forward voltage (PFV) and result in permanent damage to the SCR due to the cumulative time delay associated with triggering each successive SCR. Thus slave triggering is not desirable for greater than about 2 or 3 serially connected SCR's.

Simultaneous triggering of all gates of serially connected SCR's is generally preferred in order to prevent the voltage impressed across any individual SCR from exceeding the voltage rating of that SCR, even for a short period of time. However, when it is desired to trigger the gates of a plurality of serially connected SCR's, say generally greater than 2, it is difficult using present schemes, such as direct transformer triggering from a plurality of secondary coils (each coupled to the same primary of a pulse transformer), due to reflected impedance to the pulse transformer and high voltage isolation requirements of the pulse transformer, to provide a trigger pulse having adequate current and a rise time fast enough to ensure that all serially connected SCR's are indeed simultaneously triggered. If fewer than all serially connected SCR's are simultaneously triggered, then the entire operating voltage will be impressed across the SCR's which are not first triggered. This may cause the voltage impressed across a single SCR to exceed the voltage rating of the SCR and thus overstress the SCR, which may lead to permanent damage of the SCR. In the worst case, all but one of the serially connected SCR's is triggered. For example, assume there are five serially connected SCR's, each having a voltage rating of 1400 volts, and the series combination is blocking a voltage of 6000 volts. If it is attempted to switch all SCR's simultaneously, and one doesn't switch, then the 6000 volts will be impressed across the one which does not switch, causing it to fail. When the system next attempts to turn off (i.e. revert to the blocking state) the four remaining SCR's, the 6000 volts will be divided equally among the four SCR's. This results in a voltage of about 1500 volts across each SCR, which exceeds the voltage rating of each SCR and may cause one or more additional SCR's to fail.

In certain applications, it may be possible to use a light-fired SCR, i.e. an SCR having a gate responsive to light. However, light fired SCR's are expensive and may not be available generally. Further, a light source, such as a cesium lamp or laser LED, generally needed to ensure sufficient current to trigger a plurality of SCR's, is also expensive.

Accordingly, it is an object of the present invention to provide a means and method of triggering a plurality of serially connected SCR's which ensure simultaneous triggering of each SCR.

Another object of the present invention is to provide a means and method for triggering a plurality of serially connected SCR's using components which are readily available.

A further object of the present invention is to provide a means and method for triggering a plurality of series SCR's which are cost effective and relatively inexpensive.

Yet another object of the present invention is to provide a means and method for triggering a plurality of series SCR's wherein power to trigger each SCR comes from a relatively low voltage source and not from the relatively high operating voltage across the plurality of SCR's.

BRIEF SUMMARY OF THE INVENTION

In accordance with the present invention a method for simultaneously triggering a plurality of serially connected silicon controlled rectifiers (SCR's) having a relatively high voltage impressed across the plurality of SCR's, each SCR including a gate input to receive a triggering signal, comprises storing in each of a plurality of first storage means at least a portion of energy available from a relatively low voltage source of energy, and transferring simultaneously energy stored in each of the plurality of first storage means, respectively, to each respective gate input of a corresponding one of each of the plurality of SCR's, respectively, whereby a triggering signal is generated for each of the plurality of SCR's. Further, apparatus for simultaneously triggering a plurality of serially connected SCR's, each SCR including a gate input to receive a triggering input, comprises a plurality of energy storage means, one of each of the plurality of energy storage means, respectively, coupled to the gate input of a corresponding one of each of the plurality of SCR's, respectively, and a plurality of switching means responsive to a separate timing signal, one of the plurality of switching means coupled between each respective one of the plurality of energy storage means and the gate input of the corresponding one of the plurality of SCR's, respectively, for transferring energy from each of the plurality of energy storage means to the gate input of the corresponding SCR, respectively, in response to the timing signal.

The features of the invention believed to be novel are set forth with particularity in the appended claims. The invention itself, however, both as to organization and method of operation together with further objects and advantages thereof, may best be understood by reference to the detailed description taken in connection with the accompanying drawing.

DESCRIPTION OF THE DRAWING

FIGS. 3A-3F are voltage and current waveforms at selected nodes of the circuits shown in FIGS. 1 and 2.

DETAILED DESCRIPTION

Figure 1:
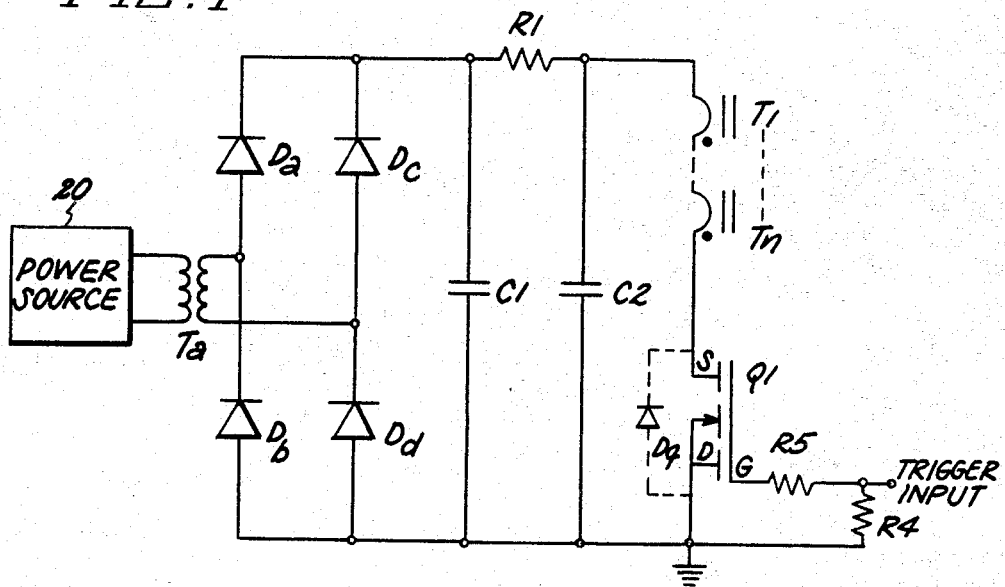
FIGS. 1 and 2 are circuit diagrams of electrical apparatus useful with the present invention.

Referring to FIG. 1, an alternating current power source 20, such as from a public utility, is connected to the primary winding of an isolation transformer $T_a$. One side of the secondary winding of isolation transformer $T_a$ is connected to the anode of diode $D_a$ and the other side of the secondary winding is connected to the anode of diode $D_c$. Diodes $D_a$, $D_b$, $D_c$ and $D_d$ comprise a diode bridge for rectifying the alternating current voltage appearing at the secondary of isolation transformer $T_a$. The cathodes of diodes $D_a D_c$ are each connected to one side of filter capacitor C1 and current limiting resistor R1. The other side of resistor R1 is connected to charging capacitor C2 and to one side of the primary of a first pulse transformer T1. The primary winding of each of a plurality of pulse transformers $T_1$-$T_n$ are connected in series and have phasing as indicated by the heavy dot. The output of the primary winding of pulse transformer $T_n$ is connected to switching means, such as a bipolar transistor or, preferably, the source S of a field effect transistor (FET) Q1 capable of rapidly switching, say at about 1 megahertz, into and out of conduction. FET Q1 may be a type IRF250 power FET manufactured by International Rectifier, El Segundo, Calif., or the like. FET Q1 comprises an internal diode Dq for shunting reverse current in order to protect the FET from a reverse current surge. The drain D of FET Q1 is connected to ground potential. A trigger input is connected to the gate G of FET Q1 through series resistor R5 and to ground potential through shunt resistor R4. The other side of capacitors C1 and C2 and the anodes of diodes $D_b$ and $D_d$ are each connected to ground potential. The cathodes of diodes $D_b$ and $D_d$ are connected to the anodes of diodes $D_a$ and $D_c$, respectively.

The value of capacitor C2 is small, say about 0.22 microfarads, such that it is charged fully between switching cycles of FET Q1, whereas the value of capacitor C1 is relatively large, say about 50 microfarads, in order to provide a substantially DC current through resistor R1 while capacitor C2 is charging. Alternatively, resistor R1 may be replaced by a choke or inductor in order to conserve power, since during each switching cycle of FET Q1, the equivalent power used to generate pulses in pulse transformers $T_1$ through $T_n$ is dissipated in resistor R1. Power source 20, isolation transformer $T_a$, bridge diodes $D_a$-$D_d$, filter capacitor C1 and current limiting resistor R1 comprise a DC current supply.

The trigger input or control signal supplied to the junction of resistors R4 and R5 renders FET Q1 conductive, permitting capacitor C2 to discharge through the primary windings of pulse transformers $T_1$-$T_n$ to ground potential during the trigger pulse interval. The pulse width of the trigger input to FET Q1 should be just wide enough to permit capacitor C2 to fully discharge. If the pulse width is longer, current will be drawn from the DC supply through resistor R1 causing pulse transformers $T_1$-$T_n$ to saturate. Saturation is undesirable since it reduces the sensitivity and responsiveness of the voltage output of the secondary winding to an incremental change in current through the primary winding. The relatively small value of capacitor C2 yields a faster current change when the energy stored is discharged through the serially connected primaries of pulse transformers $T_1$-$T_n$. The DC supply should be selected to have an optimum output impedance that permits rapid charging and recharging of capacitor C2. In order to adequately charge C2, energy losses, i.e. $I^2 R1$, during charging of C2 should be relatively low.

Figure 2:
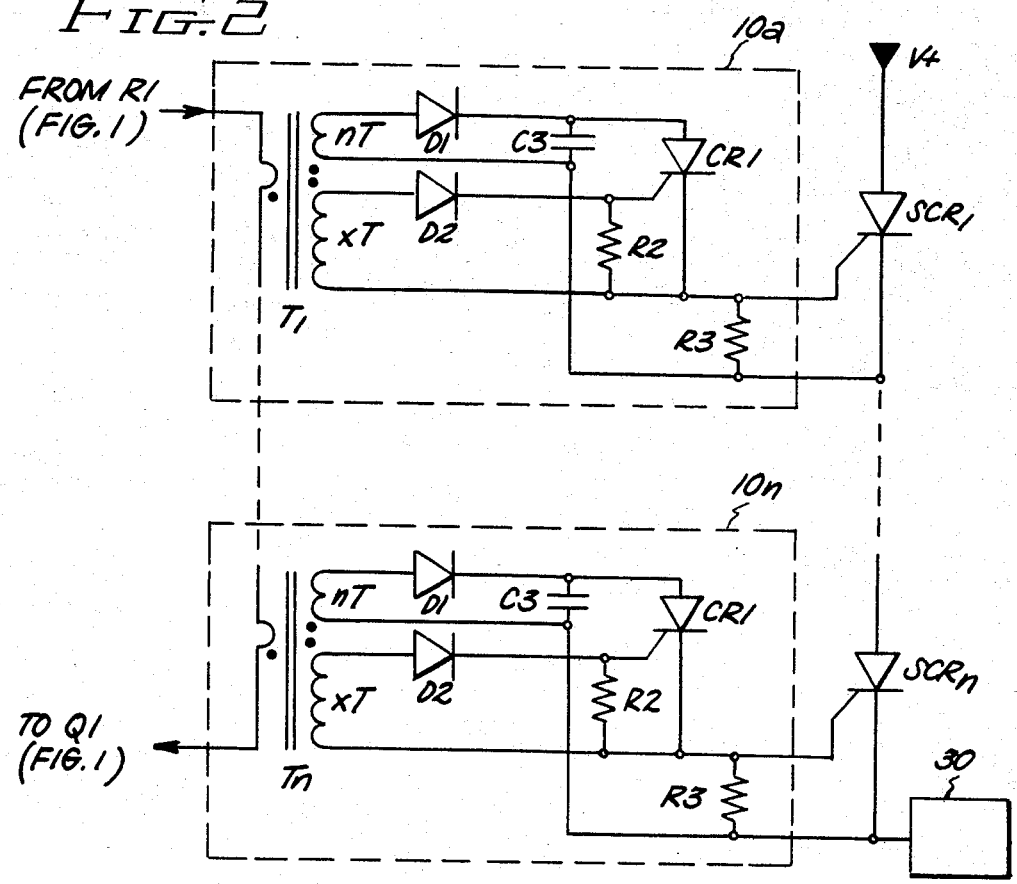

Referring to FIG. 2, a plurality of interconnected pulse forming circuits $10_a$-$10_n$ are shown. These circuits, driven by pulse transformers $T_1$-$T_n$, are identical, and only circuit $10_a$ will be described for convenience, with the understanding that all other pulse forming circuits operate in an analogous manner.

There is shown one pulse forming circuit for each of the serially connected SCR's (main SCR's), $SCR_1$-$SCR_n$, for which it is desired to provide simultaneous triggering. The anode of a diode D1 is connected through a first secondary winding of pulse transformer $T_1$ to one side of a storage capacitor C3, one side of a resistor R3 and the cathode of main $SCR_1$. Each first secondary winding of pulse transformers $T_1$-$T_n$ should have a number of turns (nT) equal to an integral multiple of the number n of pulse transformers $T_1$-$T_n$ in the system in order to ensure that the effect of current through the primary windings of pulse transformers $T_1$-$T_n$ will be equally divided among each respective pulse transformer $T_1$-$T_n$. The cathode of diode D1 is connected to the other side of capacitor C3 and to the anode of switch CR1, which may comprise an SCR (pilot SCR). Switch CR1 may comprise a type C141 SCR device manufactured by General Electric Co. Semiconductor Products Department, Auburn, N.Y., or the like. The anode of diode D2 is connected through a second winding of the secondary of pulse transformer $T_1$ to one side of resistor R2, the other side of resistor R3, the cathode of pilot SCR CR1 and the gate of main $SCR_1$. Each second secondary winding of pulse transformers $T_1$-$T_n$ may have a number of turns (xT) which is greater than that of each respective first secondary winding, for example 2nT, since the current requirement in the second secondary winding circuit, say about 300 ma, is lower than the current required in the first secondary winding circuit, say about 8 amps. However, the number of turns of each second secondary winding cannot be made arbitrarily large, since the capacitance of the secondary winding circuit is reflected to the primary winding in proportion to the turns-ratio squared, i.e. $(N_s/N_p)^2$, where $N_s$ is the number of secondary turns and $N_p$ is the number of primary turns, and too much primary capacitance will cause the rise time of the primary pulse to be too slow. The cathode of diode D2 is connected to the other side of resistor R2 and to the gate of pilot SCR CR1. The anode of main $SCR_1$ is connected to a source of voltage V+, wherein V+ is greater than the forward blocking voltage threshold of each individual main $SCR_1$-$SCR_n$, respectively. The cathode of main $SCR_n$ is connected to circuitry 30 which may comprise inductors and/or capacitors to generate voltage at a resonant frequency (i.e., having a zero crossing) when main SCR's $SCR_1$ through $SCR_n$ are triggered into a conductive state, in order to switch main SCR's $SCR_1$ through $SCR_n$ into a non-conducting state at the zero crossing of the voltage generated. Each of main $SCR_1$-$SCR_n$ may comprise a type C478 SCR device manufactured by General Electric Co. Semiconductor Products Department, Auburn, N.Y., or the like.

Referring to FIGS. 3A–3F, the operation of the circuits shown in FIGS. 1 and 2 will now be described. Referring to FIG. 3A, the trigger input signal to FET Q1 (FIG. 1) is shown. As the trigger signal transitions positively, FET Q1 begins to conduct, which forces the source S potential to equal the drain D potential (less a small voltage drop across FET Q1), and allows capacitor C2 to discharge through the primary windings of pulse transformers $T_1$-$T_n$ and through FET Q1 to ground potential. As the voltage across capacitor C2 (shown in FIG. 3B) discharges, current as shown in FIG. 3C flows through the primary windings of pulse transformers $T_1$-$T_n$. The current through the primary windings of pulse transformers $T_1$-$T_n$ causes an alternating voltage, as shown in FIG. 3D, to appear across each secondary winding of pulse transformers $T_1$-$T_n$. The positive half cycle, which is substantially equal to the negative half cycle, of the voltage appearing across the first secondary winding of pulse transformer $T_1$ causes current to flow through diode D1 to charge capacitor C3. Thus the energy stored in capacitor C3 is transferred thereto from a relatively low voltage source through pulse transformer $T_1$ during the positive half cycle of the voltage appearing across the first secondary winding of pulse transformer $T_1$, and not from the relatively high operating voltage $+V$ through voltage dividers as is known in the art. The circuit of the present invention doesn't waste power in such voltage dividers and is further independent of operational voltage $+V$, wherein a decrease in operational voltage $+V$ may generate a marginal trigger level in prior schemes using such voltage dividers. Since the polarities of the first and second windings of the secondary of transformer $T_1$ are as shown by the heavy dots, no current will flow through the second secondary winding of pulse transformer T1 during the positive half cycle of the voltage. When the voltage across the secondary windings reverses polarity during the negative half cycle (FIG. 3D), the voltage across the second secondary winding of pulse transformer $T_1$ causes current to flow through diode D2 and into the gate of pilot SCR CR1 thereby forming a timing signal for pilot SCR CR1. The current into the gate of pilot SCR CR1 turns on pilot SCR CR1 and allows capacitor C3 to discharge through pilot SCR CR1 into the gate of main SCR1. Thus a pulse of energy is provided to capacitor C3 of duration substantially half that of the discharge of energy stored in capacitor C2. Alternatively, any other switching device which is responsive to fast current changes and allows capacitor C3 to discharge into the gate of main SCR SCR 1 may be used. FIG. 3E shows the voltage across capacitor C3 and FIG. 3F shows the current (triggering signal) into the gate of main $SCR_1$. Resistors R2 and R3 are connected between the gates and cathodes of pilot SCR CR1 and main $SCR_1$, respectively, in order to keep the respective gates of the SCRs from floating, thereby avoiding misfiring or false triggering.

In order to generate a sufficient voltage difference between the gate and cathode of main $SCR_1$, high voltage isolation is necessary between the gate and cathode of main $SCR_1$ and the switch signal source. Pulse transformers provide a convenient means for obtaining such high voltage isolation.

A relatively fast rise time, i.e. less than about 1 microsecond for the current into the gate of main SCR1, is obtained since there is no inductance or appreciable series resistance coupled with inherent capacitance (only impedance of turned-on pilot SCR CR1 and impedance of the gate of main $SCR_1$) in main $SCR_1$ gate circuit. In fact, the faster the rise time of the current into the gate of main $SCR_1$ the better, since simultaneous triggering of main SCR's $SCR_1$-$SCR_n$ may then be assured. If the rise time of the gate current of main SCR's $SCR_1$-$SCR_n$ is too slow, it is not possible to ensure simultaneous triggering, because the threshold gate current needed to turn on an individual SCR may vary between similar devices. In such cases, the interval between switching an SCR having a lower gate current threshold and an SCR having a higher gate current threshold by a gate current having a slow rise time may be great enough so that the forward voltage impressed across the latter switching SCR exceeds its voltage rating.

Such circuits as are disclosed here may be used in high-voltage or high-power inverters where a source of DC voltage $(+V)$ is periodically switched to produce an AC voltage.

Thus has been shown and described a means and method for triggering a plurality of serially connected SCR's, from components which are readily available, which ensure simultaneous triggering of each SCR. Further the means and method are cost effective and relatively inexpensive. Additionally, the power used to trigger the SCR's is obtained from ground potential and not from the operating voltage supply across the series SCR's.

While only certain preferred features of the invention have been shown by way of illustration, many modifications and changes will occur to those skilled in the art. It is to be understood that the appended claims are intended to cover all such modifications and changes as will occur to those skilled in the art.

What is claimed is:

1. A method for simultaneously triggering a plurality of serially connected silicon controlled rectifiers (SCR's) having a relatively high voltage impressed across the plurality of SCR's, each SCR including a gate input adapted to receive a triggering signal thereto, comprising:
  (a) storing in each of a plurality of first storage means at least a portion of energy available from a relatively low voltage source of energy;
  (b) storing at least said portion of the energy available from said source of energy in a second storage means;
  (c) transferring energy stored in said second storage means to each of said plurality of first storage means by discharging the energy stored in said second storage means through each primary winding, respectively, of a plurality of pulse transformers, respectively, each pulse transformer comprising a secondary winding connected to a respective one of said plurality of first storage means so as to provide a pulse of energy thereto of duration substantially half that of the discharge of energy stored in said second storage means; and (d) releasing simultaneously the energy stored in each of said plurality of first storage means, respectively, to each respective gate input of a corresponding one of each of said plurality of SCR's, respectively, whereby a triggering signal is generated for each of said plurality of SCR's.

2. Apparatus for simultaneously triggering a plurality of serially connected silicon controlled rectifiers (SCR's), each SCR including a gate input adapted to receive a triggering signal, comprising:

(a) a plurality of energy storage means, one of each said plurality of energy storage means, respectively, coupled to the gate input of a corresponding one of each said plurality of SCR's, respectively, (b) a plurality of switching means, each of said plurality of switching means responsive to a separate timing signal, respectively, each respective one of said plurality of switching means coupled between each respective one of said plurality of energy storage means and the gate input of said corresponding one of said plurality of SCR's, respectively, for transferring energy from each said plurality of energy storage means to the gate input of said corresponding SCR, respectively, in response to said timing signal, respectively, and (c) a plurality of pulse transformers each including a first secondary winding coupled to a respective one of each said plurality of energy storage means for transferring energy thereto and a second secondary winding coupled to a respective one of each said switching means for respectively supplying the timing signal thereto.

3. The apparatus as in claim 2 further comprising:

(a) a first plurality of diodes, each diode including an anode and a cathode, wherein the anode of each said first plurality of diodes is connected to the respective first secondary winding of each said plurality of pulse transformers and the cathode of each said first plurality of diodes is coupled to the respective one of said plurality of storage means; and (b) a secondary plurality of diodes, each diode of said second plurality including an anode and a cathode, wherein the anode of each said second plurality of diodes is connected to the respective second secondary winding of said plurality of pulse transformers and the cathode of each said second plurality of diodes is coupled to the respective one of said plurality of switching means for supplying said timing signal respectively thereto, wherein the phasing of said first and second secondary winding of each respective pulse transformer is such that said first plurality of diodes permits current flow therethrough only during the first half of a voltage waveform available at the respective first secondary winding and further such that said second plurality of diodes permits current flow therethrough only during the second half of said voltage waveform available at the respective second secondary winding.

4. The apparatus as in claim 2, wherein each of said pulse transformers includes a respective primary winding and wherein the primary windings of the plurality of pulse transformers are serially connected, each of said primary windings having the same relative phasing, the primary winding of a first of said plurality of pulse transformers being coupled to a source of energy with respect to a reference potential, said apparatus further comprising additional switching means coupled to the primary winding of a last of said plurality of pulse transformers for operationally connecting the primary winding of the last of said plurality of pulse transformers to said reference potential.

5. The apparatus as in claim 4 wherein said additional switching means comprises a field effect transistor.

* * * * *